United States Patent
Gopalan et al.

(10) Patent No.: US 6,803,289 B1
(45) Date of Patent: Oct. 12, 2004

(54) BIPOLAR TRANSISTOR AND METHOD FOR MAKING THE SAME

(75) Inventors: Prabhuram Gopalan, Fremont, CA (US); K. Nirmal Ratnakumar, San Jose, CA (US); Chandrasekhar R. Gorla, Seattle, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/184,697

(22) Filed: Jun. 28, 2002

(51) Int. Cl.$^7$ .............................................. H01L 21/331
(52) U.S. Cl. ...................................................... 438/343
(58) Field of Search .................................. 438/316, 325, 438/329–332, 335, 339, 341–346; 257/378, 571, 572

(56) References Cited

U.S. PATENT DOCUMENTS

| | | | | |
|---|---|---|---|---|
| 5,972,766 A | * | 10/1999 | Kishi | 438/309 |
| 6,071,767 A | * | 6/2000 | Monkowski et al. | 438/202 |
| 6,180,442 B1 | * | 1/2001 | Gris | 438/202 |
| 6,589,849 B1 | * | 7/2003 | Lee | 438/341 |
| 6,656,812 B1 | * | 12/2003 | Marty et al. | 438/343 |
| 2001/0012655 A1 | * | 8/2001 | Nordstom et al. | 438/239 |
| 2001/0048134 A1 | * | 12/2001 | Park | 257/347 |
| 2002/0123199 A1 | * | 9/2002 | Terpstra et al. | 438/309 |
| 2002/0197808 A1 | * | 12/2002 | Schuegraf | 438/312 |
| 2003/0020166 A1 | * | 1/2003 | Kondo et al. | 257/758 |

* cited by examiner

*Primary Examiner*—Carl Whitehead, Jr.
*Assistant Examiner*—Jennifer M Dolan
(74) *Attorney, Agent, or Firm*—Kevin L. Daffer; Mollie E. Lettang; Conley Rose P.C.

(57) ABSTRACT

A method for fabricating a bipolar transistor is provided. In some cases, the method may include patterning an epitaxial layer to expose one or more regions of a semiconductor topography. The method may further include depositing an intermediate layer above the exposed regions and remaining portions of the epitaxial layer. A conductive emitter structure may then be formed above and within the intermediate layer. In another embodiment, the method may include etching a first dielectric layer in alignment with a patterned base of a bipolar transistor while simultaneously etching a second dielectric layer in alignment with a patterned emitter structure of the bipolar transistor. In yet other embodiments, the method may include depositing an intermediate layer which is substantially etch resistant to a resist stripping process. In addition or alternatively, the intermediate layer may include etch characteristics that are substantially similar to a conductive layer formed above the intermediate layer.

19 Claims, 6 Drawing Sheets

BIPOLAR TRANSISTOR AND METHOD FOR MAKING THE SAME

BACKGROUND OF THE INVENTION

1. Field of the Invention

This invention relates to semiconductor device manufacturing, and more particularly, to an improved method for fabricating a bipolar transistor.

2. Description of the Related Art

The following descriptions and examples are given as background information only.

In general, bipolar transistors offer relatively fast switching speeds and therefore, are often used in integrated circuit design. However, the fabrication of bipolar transistors typically requires several steps, thereby increasing the complexity of the fabrication process of the integrated circuit. For example, a bipolar transistor is generally fabricated by forming an epitaxial layer upon a semiconductor topography followed by the deposition of silicon dioxide and, in some embodiments, the deposition of silicon nitride. Consequently, a conductive layer formed above the dielectric layer/s may be patterned such that a conductive structure of the transistor may be formed dielectrically spaced above the epitaxial layer. In particular, the fabrication process may include patterning the dielectric and conductive layers to form the structures of the transistor. As such, the fabrication process of a bipolar transistor may further include formation of resist pattern masks and etching processes.

As stated above, silicon nitride may be used to during the fabrication of a bipolar transistor. Such a material may serve as an etch stop during the patterning of the overlying conductive layer. In some cases, the silicon nitride layer may serve to closely control the formation of the opening formed through the dielectric layers to the underlying epitaxial layer by first etching the nitride layer and then etching the silicon dioxide layer. In order to reduce the thermal budget of the fabrication process, however, the deposition of the nitride layer is often limited to a low-temperature process, specifically at temperatures less than approximately 400° C. One manner with which to deposit at such a low temperature is to use a plasma enhanced chemical vapor deposition (PECVD) process. However, nitride deposited using a PECVD process at relatively low temperatures is undesirably porous and easily deteriorates upon exposure to relatively dilute etch chemistries. Consequently, control of etching the nitride layer without substantially etching portions of underlying layers is difficult. In addition, a low-temperature deposited PECVD nitride layer may not adequately serve as an etch stop layer since the layer will be more susceptible to being etched at a faster rate than a high-temperature deposited nitride layer.

In addition, nitride is not typically deposited in uniform conformal manner using a low-temperature PECVD deposition process. In particular, PECVD nitride deposited at low temperatures typically deposits more material along horizontal surfaces of an underlying topography than along vertical surfaces of an underlying topography. For example, in some cases, low-temperature PECVD nitride deposited along a vertical surface of an underlying topography may include a thickness that is approximately 40% of the thickness of the PECVD nitride layer arranged along a horizontal surface of the underlying topography. As such, regions of the underlying topography including vertical surfaces may be exposed more quickly during an etch process than regions of the topography including horizontal surfaces. Consequently, the etch process used to remove the PECVD nitride layer may undesirably etch vertical portions of the underlying topography while portions of the PECVD nitride layer upon the horizontal surfaces of the underlying topography are being removed. The etching of such portions of the underlying topography may undesirably remove portions of device structures, affecting the functionality of the device.

In some cases, bipolar transistors may be fabricated adjacent to CMOS transistors to form a transistor commonly referred to as a "BiCMOS transistor." In such an embodiment, the gate structures of the CMOS transistors are typically formed prior to the bipolar transistors and therefore, the nitride layer may be deposited above the gate structures of the CMOS devices. In cases in which less nitride is deposited on the sidewalls of the gate structures than adjacent horizontal surfaces, the gate structures may be undesirably etched during the removal of the nitride layer. In addition, BiCMOS transistors may be susceptible to a larger accumulation of nitride material in between the transistors due to the large aspect ratio of spacings between the transistors and the nonconformal deposition characteristics of PECVD silicon nitride. Consequently, the etch process of the nitride layer may need to be extended in order to remove the entire nitride layer, particularly in between the transistors. Such an extension of the etch process may further deteriorate the gate structures and other structures arranged laterally adjacent to the transistors.

Therefore, it would be advantageous to develop a method for fabricating a bipolar transistor that overcomes one or all of the aforementioned problems. In particular, it would be beneficial to develop a method for fabricating bipolar transistor in less processing steps than the conventional method. In addition, it would be advantageous to develop an improved method for controlling the removal of exposed portions of dielectric layers within a bipolar transistor fabrication process. In particular, it would be beneficial to develop a bipolar fabrication process which does not damage structures within the topography of the transistor during the removal of dielectric layers.

SUMMARY OF THE INVENTION

The problems outlined above may be in large part addressed by an improved method for fabricating a bipolar transistor. In particular, the aforementioned problems may be addressed by using different materials and/or process sequences than those used in conventional methods to fabricate a bipolar transistor. For example, in some cases, a method for fabricating a bipolar transistor as described herein may include patterning an epitaxial layer to expose one or more regions of a semiconductor topography prior to the deposition of an intermediate layer upon the exposed regions of the semiconductor topography and remaining portions of the epitaxial layer. In other cases, the intermediate layer may be deposited upon an unpatterned epitaxial layer. In such an embodiment, the epitaxial layer may be subsequently patterned to expose one or more regions of the semiconductor topography.

In some embodiments, the one or more exposed regions of semiconductor topography may include one or more transistors formed within the semiconductor topography. In such a case, the method may include conformally depositing the intermediate layer above and about the one or more transistors such that the thickness of the intermediate layer is substantially uniform along peripheries of the one or more transistors and in spacings between the one or more transistors. Such a conformal deposition of the intermediate layer may generate a thickness variation of less than approximately 20%, for example, across the semiconductor topography. An intermediate layer, in such an embodiment, may include amorphous silicon, polysilicon, LPCVD (low pressure chemical vapor deposition) nitride, or any other material that includes such uniform deposition characteristics. In such an embodiment, the intermediate layer may be doped or substantially undoped. In other embodiments, the method may include depositing the intermediate layer above and about the one or more transistors in a non-conformal manner such that the thickness of the intermediate layer is substantially non-uniform along peripheries of the one or more transistors and in spacings between the one or more transistors. The intermediate layer, in such an embodiment, may include silicon nitride, for example, or any other material that includes such non-uniform deposition characteristics.

In some cases, the method may additionally include exposing the intermediate layer to a rapid thermal anneal subsequent to the deposition of the intermediate layer. In other cases, the method may be substantially absent of such an anneal process. In any embodiment, the method may additionally include patterning an opening within the intermediate layer using a resist mask. Furthermore, the method may include exposing the semiconductor topography to a stripping process such that the resist mask may be removed and portions of the intermediate layer may be exposed. In such an embodiment, the intermediate layer may include a material substantially etch resistant to the stripping process, such as, for example, doped or substantially undoped amorphous silicon, polysilicon, or LPCVD silicon nitride.

In any of the embodiments described above, the method may further include forming an emitter structure of the bipolar transistor above and within the intermediate layer. In particular, the method may include depositing a conductive layer above the intermediate layer and subsequently patterning one or both of the layers to form conductive emitter structure of the bipolar transistor. For example, in some embodiments, forming the emitter structure may include patterning the conductive layer and respective underlying portions of the intermediate layer using substantially similar etch process parameters. In such an embodiment, the intermediate layer may include substantially similar etch characteristics as the conductive layer. For example, the conductive layer may include doped polysilicon, while the intermediate layer may include doped or substantially undoped polysilicon. Other materials having substantially similar etch characteristics, however, may be used for the intermediate layer and conductive layer in such an embodiment. For example, the conductive layer and/or intermediate layer may include doped or substantially undoped amorphous silicon.

In other embodiments, forming the emitter structure may include patterning the conductive layer and respective underlying portions of the intermediate layer using substantially different etch process parameters. In such an embodiment, the intermediate layer may include substantially different etch characteristics than the conductive layer. For example, the intermediate layer may include silicon nitride, while the conductive layer may include doped polysilicon or amorphous silicon. Other materials having substantially different etch characteristics, however, may be used for the intermediate layer and conductive layer in such an embodiment. In either embodiment, patterning the conductive layer may include a plurality of pattern steps. For example, patterning the conductive layer may include patterning the layer at a first width and then patterning the layer at a relatively narrower width. In other embodiments, the conductive layer may be patterned in a single patterning step.

Consequently, a semiconductor topography with a bipolar transistor having a dielectric spacer interposed between an epitaxial layer and a emitter structure is provided. In some embodiments, the dielectric spacer may include the intermediate layer arranged below the emitter structure. As such, the dielectric spacer may, in some embodiments, include an upper layer with substantially similar etch characteristics as the emitter structure. In other embodiments, the dielectric spacer may include an upper layer with substantially different etch characteristics than the emitter structure. In either embodiment, a lateral dimension of the upper layer may be bound by sidewall surfaces of the emitter structure. In some cases, the dielectric spacer may further include a lower layer including substantially different etch characteristics than the upper layer. In such an embodiment, a lateral dimension of the lower layer may be narrower than the lateral dimension of the upper layer.

In some cases, the method described herein may include etching a first dielectric layer in alignment with a patterned base of the bipolar transistor while simultaneously etching a second dielectric layer in alignment with a patterned emitter structure of the bipolar transistor. In some cases, the patterned base may include a width greater than a width of the patterned emitter structure. In other embodiments, however, the patterned base may include a width substantially similar to the width of the patterned emitter structure. In some cases, such a method may include depositing the second dielectric layer upon the patterned base and depositing a first overlying layer upon the second dielectric layer. In addition, the method may include etching an opening within the first overlying layer and the second dielectric layer. Moreover, the method may include depositing a second overlying layer within the opening and upon the first overlying layer prior to the step of etching the first and second dielectric layers.

In some embodiments, the method may further include patterning the first and second overlying layers to form the patterned emitter structure. In such a case, the first and second overlying layers may each include doped polysilcon, for example. However, other conductive materials may, however, be used for each or both of the layers. In other embodiments, the method may include patterning the second overlying layer to form the patterned emitter structure. In such an embodiment, the step of etching the second dielectric layer may further include etching the first overlying layer in alignment with the patterned emitter structure. In some cases, the first overlying layer, in such an embodiment, may include undoped polysilcon. In other cases, the first overlying layer may include silicon nitride. Other dielectric materials may, however, be used for such a layer, however.

In some cases, the methods described herein may be included in a method for fabricating a semiconductor device comprising a bipolar transistor. As such, a method for fabricating such a semiconductor device may further include forming a plurality of device structures, such as CMOS transistors and/or resistors adjacent to the bipolar transistor. In some embodiments, the method may include forming a plurality of resistors upon a semiconductor topography during the formation of the bipolar transistor structure. For example, the plurality of resistors may be formed simultaneously with the emitter structure of the bipolar transistor. Alternatively, the plurality of resistors may be formed separately from the bipolar transistor. In some cases, the method may include forming a plurality of resistors subsequent to depositing the intermediate layer of the bipolar transistor upon a patterned epitaxial layer. In particular, a plurality of resistors may be formed above one or more regions of the semiconductor topography from which the epitaxial layer has been removed. In some cases, forming the plurality of resistors may include forming a conductive layer above the intermediate layer and patterning the conductive layer and respective underlying portions of the intermediate layer to form a transitional resistor structure. The transitional resistor structure may then be patterned to form the plurality of resistors. Alternatively, forming the plurality of resistors may be conducted in a single patterning step. In some cases, the transitional resistor structure may be patterned such that the plurality of resistors have a common dielectric layer. In some embodiments, the common dielectric layer may include one or more materials substantially similar to the dielectric spacer of the bipolar transistor.

There may be several advantages to fabricating a bipolar transistor using the method described herein. In particular, a bipolar transistor may be fabricated in fewer process steps than the conventional method for forming bipolar transistors. Furthermore, additional structures may be concurrently formed upon the semiconductor topography with the bipolar transistor. For example, resistors may be formed concurrently with the bipolar transistors. As a result, production throughput of the fabrication process may increase and material usage may decrease since fewer layers will have to be deposited and etched. Consequently, fabrication costs may be reduced. Another advantage of the method described herein is that structures and layers arranged within the semiconductor topography may not be damaged by the dielectric removal process of the bipolar fabrication process. For example, the method may prevent CMOS transistors arranged within the topography from being damaged. Consequently, the functionality of the device may not be affected by the fabrication of the bipolar transistor and therefore, production yield may be increased. In addition, the method described herein offers a manner in which the portion of the epitaxial layer adjacent to the conductive emitter structure is prevented from being substantially etched. Consequently, the resistance of a contact structure formed upon such a portion of the epitaxial layer may be reduced.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

In general, the formation of a bipolar transistor using conventional methods may include growing an epitaxial layer across a semiconductor topography followed by the deposition of silicon dioxide and, in some embodiments, the deposition of silicon nitride upon the epitaxial layer. An opening may be formed within the dielectric layers to expose an underlying portion of the epitaxial layer.

Subsequently, a conductive layer may be deposited within the opening and upon adjacent portions of the topography. A conductive structure, such as a conductive structure for an emitter region of the bipolar transistor, may then be formed by patterning the conductive layer. Consequently, the conductive structure may be formed in contact with the epitaxial layer through the opening and dielectrically spaced from the epitaxial layer in regions adjacent to the opening. The fabrication process may further include a cleaning step to remove exposed portions of the dielectric layers such that the silicon dioxide and silicon nitride layers are primarily arranged between the conductive structure and the epitaxial layer.

Typically, resist masks are used to pattern the dielectric and conductive layers to form the opening and the conductive structure. As such, conventional fabrication processes generally include removing a resist mask associated with each patterning step before further processing of the device. Unfortunately, the resist strip process is typically not etch selective to silicon nitride and silicon dioxide. Consequently, portions of the dielectric layers may be etched while removing the resist masks. In particular, portions of the dielectric layers may be removed subsequent to the formation of the opening within the dielectric layers and/or after the formation of the conductive structure. In this manner, the dielectric layers may be exposed to two stripping processes; one conducted during the resist mask removal process and the other conducted during the cleaning step.

Such an excessive exposure to stripping processes may expose underlying materials to be etched by the resist stripping process and/or the cleaning process, consequently damaging underlying structures and layers. For example, the removal of the dielectric layers may cause gouging of the epitaxial layer, increasing resistance of contacts formed upon the epitaxial layer. In addition, the exposed surfaces of the dielectric layers arranged below the conductive structure may be further etched during the removal of the resist mask used to pattern the conductive structure. Such an additional stripping process may cause the dielectric layers to be misaligned with the overlying conductive structure, reducing the dielectric capacitance between the conductive structure and the epitaxial layer. After the conductive emitter structure is formed, the epitaxial layer may be patterned to remove portions of the layer extending across the topography. At this point in the fabrication process, other structures, such as resistors may be formed upon the topography by depositing additional dielectric layers and conductive layers on the semiconductor topography. As such, the formation of each structure within the device increases the complexity and process time of such a conventional fabrication process.

Figure 1:
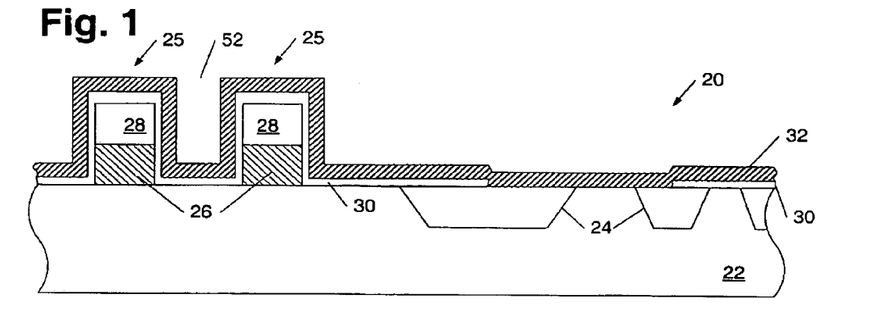
FIG. 1 depicts a partial cross-sectional view of a semiconductor topography including an epitaxial layer.

Turning to the drawings, exemplary embodiments of a method for fabricating a bipolar transistor are provided. In particular, exemplary embodiments of a method for fabricating a conductive structure for an emitter region of a bipolar transistor is provided. In addition, exemplary embodiments of fabricating a semiconductor device including a bipolar transistor are provided. FIG. 1 depicts semiconductor topography 20 including epitaxial layer 32 grown upon exposed portions of dielectric spacer 30 and semiconductor substrate 22. As shown in FIG. 1, dielectric spacer 30 is formed above portions of semiconductor substrate 22 and gate structures 25.

Semiconductor substrate 22 may be a silicon substrate, and may in some embodiments be doped either n-type and/or p-type. In some embodiments, semiconductor substrate 22 may be a monocrystalline silicon substrate. Alternatively, semiconductor substrate 22 may include structures and layers formed upon a semiconductor substrate, such as a monocrystalline silicon substrate. The structures and layers may include, but are not limited to, gate dielectric layers, gate structures, contact structures, local interconnect wires, additional dielectric layers, or metallization layers. In such a case, semiconductor substrate 22 preferably includes an interlevel dielectric layer formed above such layers and structures. In addition, semiconductor substrate 22 may further include an epitaxial layer formed upon the interlevel dielectric such that the substrate may include a silicon-on-insulator (SOI) base on which structures and layers, such as gate structures 25 and dielectric spacer 30, may be formed. Furthermore, the semiconductor substrate 22 may include shallow trench isolation regions 24 formed within a semiconductor substrate or within a layer formed upon a substrate.

Although two gate structures are shown within semiconductor topography 20, any number of gate structures may be included within the topography. Alternatively, semiconductor topography 20 may be substantially absent of gate structures upon the portion of semiconductor substrate 22 shown in FIG. 1. In general, gate structures 25 may be used to form transistors. In particular, diffusion regions such as, lightly doped drain regions and heavily doped source/drain regions, may be formed within substrate 22 aligned to gate structures 25 to form transistors. Such a formation of diffusion regions may be subsequent to the formation of the bipolar transistor as described herein. In some cases, gate structures 25 may be used to form CMOS transistors. In such an embodiment, the method described herein may pertain to the fabrication process of a BiCMOS transistor. Alternatively, the method described herein may refer to the fabrication of a "regular" bipolar transistor. A "regular" bipolar transistor as used herein may refer to a bipolar transistor which is not used in conjunction with adjacent CMOS transistors.

In either case, gate structures 25 may be fabricated prior to the deposition of epitaxial layer 32. In particular, gate structures 25 may be fabricated by patterning a lower conductive layer and an upper dielectric layer upon semiconductor substrate 22 to form lower portion 26 and upper portion 28, respectively. The thicknesses of upper and lower portions 26 and 28 may be between approximately 300 angstroms and approximately 3000 angstroms or more specifically, approximately 1000 angstroms. However, larger or smaller thicknesses of upper and lower portions 26 and 28 may be appropriate depending on the design specifications of the device. Lower portion 26 may include any conductive material, such as doped amorphous silicon, doped polysilicon, aluminum, copper, titanium, tungsten, or any metal alloy or silicide thereof. Upper portion 28, on the other hand, may include, a dielectric material to isolate the upper surface of lower portion 26 from overlying layers and structures. For example, upper portion 28 may include silicon dioxide, silicon nitride, or silicon oxynitride. In other embodiments, upper portion 28 may be omitted from gate structures 25. In such a case, dielectric spacer 30 may be formed upon and in contact with lower portion 26. The thickness of dielectric spacer 30 may be between approximately 15 angstroms and approximately 300 angstroms or more specifically, approximately 100 angstroms. However, larger or smaller thicknesses of dielectric spacer 30 may be appropriate depending on the design specifications of the device.

In either case, dielectric spacer 30 may include a material with which to isolate gate structures 25 and portions of semiconductor substrate 22 from epitaxial layer 32. In some cases, dielectric spacer 30 may serve as an etch stop for the subsequent removal of epitaxial layer 32 over gate structures 25 and portions of semiconductor substrate 22. In particular, dielectric spacer 30 may serve to protect underlying portions of semiconductor topography 20 during the removal of epitaxial layer 32 after the formation of the bipolar transistor. In addition, dielectric spacer 30 may include a material from which epitaxial layer 32 may be grown. For example, dielectric spacer 30 may include silicon dioxide, silicon nitride, or silicon oxynitride. In some cases, dielectric spacer 30 may include a bi-layer of silicon dioxide and silicon nitride. In such an embodiment, the silicon nitride portion may serve as an etch stop layer and the silicon dioxide portion may serve as a pad oxide to reduce the inherent stresses between semiconductor substrate 22 and the silicon nitride portion.

Preferably, dielectric spacer 30 is patterned to expose a portion of semiconductor substrate 22 upon which a bipolar transistor may be formed. Epitaxial layer 32 may be further grown upon such an exposed portion of substrate 22 as shown in FIG. 1. The growth of epitaxial layer 32 may include techniques used in the semiconductor industry. For example, the growth of epitaxial layer 32 may include exposing semiconductor topography 20 to a heated ambient of silane, dichlorosilane, germanium, phosphide, and/or indium. As such, epitaxial layer 32 may include silicon, silicon germanium, silicon germanium carbon, or indium phosphide. In addition, the thickness of epitaxial layer 32 may be between approximately 15 angstroms and approximately 300 angstroms or more specifically, approximately 100 angstroms. However, larger or smaller thicknesses of epitaxial layer 32 may be appropriate depending on the design specifications of the device.

Figure 2:
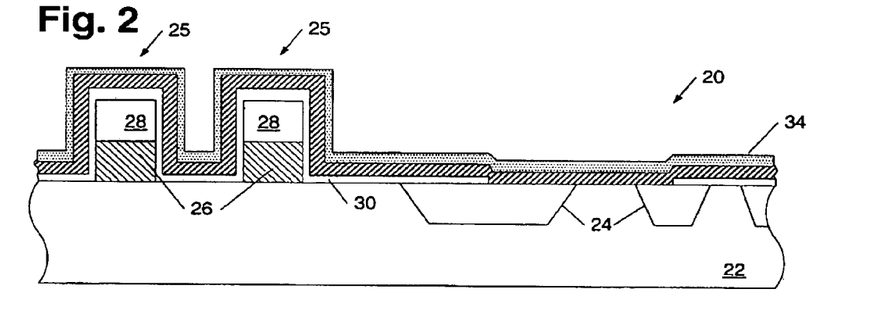
FIG. 2 depicts a partial cross-sectional view of the semiconductor topography of FIG. 1, in which a dielectric layer has been deposited upon the epitaxial layer.
Figure 3:
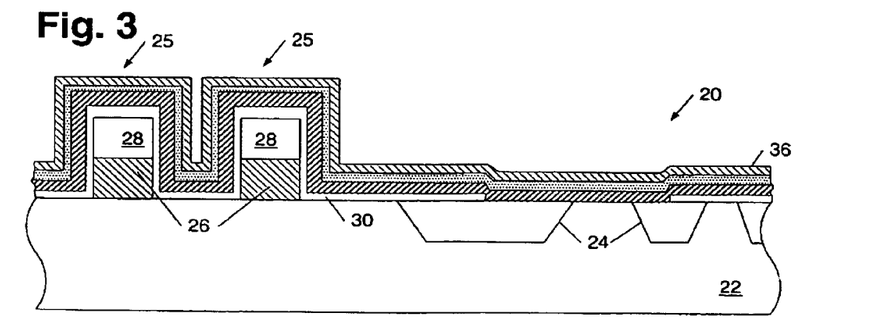
FIG. 3 depicts a partial cross-sectional view of the semiconductor topography in which a cap layer has been deposited upon the dielectric layer subsequent to the deposition of the dielectric layer in FIG. 2.

Subsequent to the formation of epitaxial layer 32, dielectric layer 34 may be formed upon epitaxial layer 32 as shown in FIG. 2. Dielectric layer 34 may include a dielectric material such as silicon dioxide, silicon nitride, silicon oxynitride, or silicon dioxide/silicon nitride/silicon dioxide (ONO). In addition, the thickness of dielectric layer 34 may be between approximately 100 angstroms and approximately 1000 angstroms or more specifically, approximately 400 angstroms. However, larger or smaller thicknesses of dielectric layer 34 may be appropriate depending on the design specifications of the device. In some cases, dielectric layer 34 may serve as a pad oxide to adhere an overlying material to epitaxial layer 32. In addition or alternatively, dielectric layer 34 may serve to reduce the inherent stresses between epitaxial layer 32 and an overlying layer. Such an overlying layer may be deposited upon dielectric layer 34 as shown in FIG. 3. In particular, FIG. 3 depicts cap layer 36 formed upon dielectric layer 34. The thickness of cap layer 36 may be between approximately 100 angstroms and approximately 1000 angstroms or more specifically, approximately 600 angstroms. However, larger or smaller thicknesses of cap layer 36 may be appropriate depending on the design specifications of the device. The deposition of layers 34 and 36 may include any deposition techniques used in the semiconductor industry. For example, the deposition of dielectric layer 34 and cap layer 36 may include chemical vapor deposition (CVD) or physical vapor deposition (PVD) processes.

Figure 5:
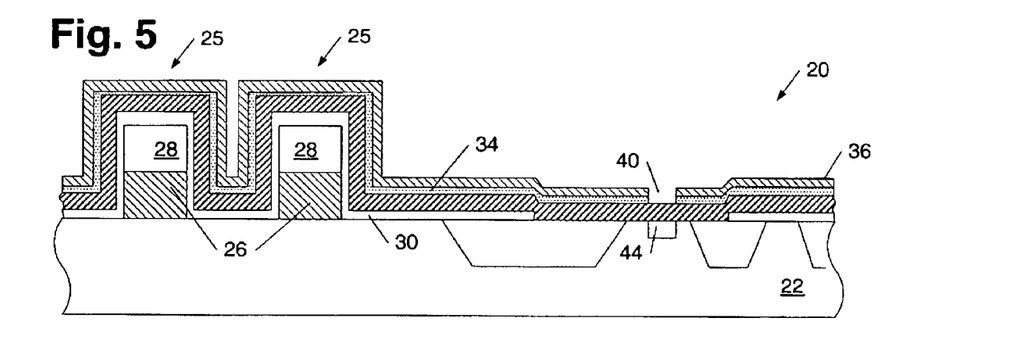
FIG. 5 depicts a partial cross-sectional view of the semiconductor topography in which the opening has been further formed within the dielectric layer subsequent to the formation of a dopant region within an underlying portion of the semiconductor topography in FIG. 4.

In general, cap layer 36 may include a material which is substantially etch resistant to a resist mask stripping process introduced subsequent to patterning an opening within cap layer 36 as shown in FIG. 5 and described in more detail below. In some cases, cap layer 36 may include substantially different etch characteristics than dielectric layer 34. In addition or alternatively, cap layer 36 may include substantially similar etch characteristics as the conductive layer used to form the conductive structure of the emitter region of the bipolar transistor. A further description of such a conductive layer is described in more detail below in reference to FIG. 6. In some cases, for example, cap layer 36 may include amorphous silicon or polysilicon and may be insitu doped, implanted doped, or substantially undoped. In such embodiments, cap layer 36 may be deposited conformally over semiconductor topography 20. In particular, cap layer 36 may include a material which is deposited with a uniform thickness upon the horizontal and vertical surfaces of semiconductor topography 20. For example, the thickness variation of cap layer 36 may vary by less than approximately 20% across semiconductor topography 20 subsequent to being deposited. In some cases, cap layer 36 may be deposited having a thickness variation less than approximately 10% across semiconductor topography 20 or more specifically less than approximately 5%.

In other cases, cap layer 36 may include a material having substantially different etch characteristics than the conductive layer used to form the conductive structure of the bipolar transistor. For example, in some embodiments, cap layer 36 may include materials, such as silicon oxide, silicon nitride, or silicon oxynitride. In such a case, cap layer 36 is preferably deposited at a relatively low temperature. In particular, cap layer 36 may be deposited at a temperature between 300° C. and approximately 650° C., or more specifically at approximately 400° C. Such a relatively low-temperature deposition process may allow the thermal budget of the device to be maintained, increasing the reliability of the device. In particular, a low thermal budget may allow the stability of epitaxial layer 32 to be maintained.

In some embodiments, cap layer 36 may include nitride layer deposited by a plasma enhanced chemical vapor deposition (PECVD) process. Unfortunately, however, low-temperature deposited dielectrics, such as silicon nitride, deposited using PECVD processes typically do not deposit uniformly, particularly over regions of nonplanarity. More specifically, a silicon nitride layer deposited by a low-temperature PECVD deposition technique may be thinner along the sidewalls of gate structures 25 than along adjacent portions of semiconductor substrate 22. In addition, a low-temperature PECVD deposited silicon nitride layer may be particularly porous and substantially etch selective to a variety of dilute etch chemistries. As such, in an embodiment in which cap layer 36 includes PECVD low-temperature nitride, cap layer 36 may be densified subsequent to being deposited. In particular, cap layer 36 may be densified to decrease the etch rate of the layer. In this manner, cap layer 36 may be etched at a slow enough rate to serve as an etch stop layer. In some embodiments, the etch rate of a densified PECVI) low temperature nitride layer may be less than approximately 20% of the etch rate of a non-densified PECVD low temperature nitride layer, depending on the parameters of the densification process.

In any embodiment, densifying the PECVD low-temperature nitride layer may produce a cap layer that is substantially etch resistant to dilute etch chemistries while maintaining the thermal budget specification of the fabrication process. Such a densification process may include exposing semiconductor topography 20 to a rapid thermal anneal (RTA) treatment process. Such a RTA process may be include exposing semiconductor topography 20 to a temperature between approximately 800° C. and approximately 1100° C. For example, the RTA process may expose semiconductor topography 20 to a relatively high temperature for less than a minute. Such a process may be substantially shorter than the process time of a high-temperature deposition process. For example, a relatively high deposition process for silicon nitride may take between approximately 15 minutes and approximately 30 minutes.

In yet other embodiments, cap layer 36 may include a nitride layer deposited by a low pressure chemical vapor deposition (LPCVD) process. In general, a LPCVD process may produce a nitride layer that is substantially different than a nitride layer deposited by a PECVD process. In particular, a LPCVD nitride layer may be deposited conformally and with a uniform thickness upon the horizontal and vertical surfaces of an underlying topography. In this manner, the thickness variation of cap layer 36, in an embodiment in which cap layer 36 includes a LPCVD nitride layer, may vary by less than approximately 20% across semiconductor topography 20 subsequent to being deposited. In some cases, cap layer 36, in such an embodiment, may be deposited having a thickness variation less than approximately 10% across semiconductor topography 20 or more specifically less than approximately 5%. In addition, a LPCVD nitride layer may be deposited at a relatively low temperature, as described above, such that the thermal budget of the fabrication process may be maintained.

Figure 4:
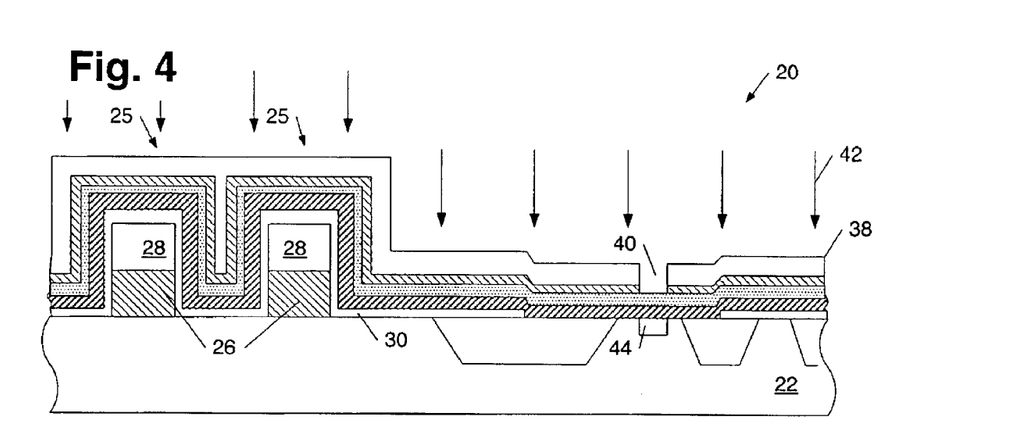
FIG. 4 depicts a partial cross-sectional view of the semiconductor topography in which an opening has been formed within the cap layer subsequent to the deposition of the cap layer in FIG. 3.

As shown in FIG. 4, resist mask 38 may be formed upon portions of cap layer 36. Resist mask 38 may include a photoresist, such as a deep ultraviolet resist, an I-line resist, a G-line resist, or another resist, such as an e-beam resist or an x-ray resist. In addition, the thickness of resist mask 38 may be between approximately 600 angstroms and approximately 3000 angstroms or more specifically, approximately 1500 angstroms. However, larger or smaller thicknesses of resist mask 38 may be appropriate depending on the design specifications of the device. Resist mask 38 may be patterned using a lithography technique, such that exposed portions of cap layer 36 may be etched to form opening 40 as shown in FIG. 4. Such an etch process may include wet etch and/or dry etch techniques including phosphoric acid, for example. Other etch techniques and or chemistries may be used, however, depending on the material of cap layer 36. In a case in which, cap layer 36 includes amorphous silicon, etch process may be substantially more etch selective to cap layer 36 than dielectric layer 34. For example, the etch selectivity between cap layer 36 and dielectric layer 34 in such an embodiment, may be between 300:1 to approximately 500:1 or more specifically, approximately 400:1. In this manner, substantial portions of dielectric layer 34 may be prevented from being removed during the formation of opening 40.

Subsequently, semiconductor topography 20 may be exposed to implant ions 42 to form sub-collector region 44 in the portion of semiconductor substrate 22 extending below opening 40. Implant ions 42 may include either n-type or p-type ions, depending on the design of the bipolar transistor. In particular, for a NPN bipolar transistor, implant ions 42 may include n-type dopants such as phosphorus, arsenic, or antimony, for example. In contrast, implant ions 42 may include p-type dopants, such as boron, boron difluoride, or indium, for example, to form a PNP transistor.

In either embodiment, resist mask 38 may be subsequently removed as shown in FIG. 5. Such a stripping process may include wet etch or reactive ion etch techniques. As stated above, cap layer 36 preferably includes a material which is substantially resistant to the stripping process of resist mask 38. In this manner, substantial portions of cap layer 36 may not be removed during the removal of resist mask 38. This is distinctly different from conventional techniques in which a non-densified silicon nitride layer is used as a cap layer. In conventional methods, the stripping process of resist mask 38 would further etch such a non-densified silicon nitride layer. In some cases, the resist removal process may etch through the non-densified silicon nitride layer, particularly in regions wherein the layer is relatively thin, such as along vertical surfaces of the underlying topography. Consequently, the semiconductor topography may not have an etch stop layer with which to stop further etch processes. Eventually, such additional etch processes may undesirably etch portions of dielectric layer 34, epitaxial layer 32, and eventually gate structures 25, affecting the functionality of the devices.

Semiconductor topography 20 may be further exposed to a cleaning process subsequent to the resist removal process. In some embodiments, the cleaning process may include exposing semiconductor topography 20 to an etch chemistry having a ratio of deionized water to hydrofluoric acid to be approximately 100:1. However, other etch chemistry ratios and/or components may be used for the cleaning process, depending on the design specifications of the device. In any case, the cleaning process may include removing residual amounts of dielectric layer 34 within opening 40 as shown in FIG. 5. In conventional processes, however, such a cleaning process may further etch regions of dielectric 34 and epitaxial layer 32 which have been exposed by the removal of a non-densified silicon nitride layer during the resist removal process. As a result, gate structures 25 may be undesirably etched by the cleaning process in conventional processes. However, in the method described herein, cap layer 36 is substantially etch resistant to both the resist removal process and cleaning process. Consequently, portions of dielectric layer 34, epitaxial layer 32, and gate structures 25 underlying resist mask 38 and cap layer 36 may not be undesirably removed.

Figure 6:
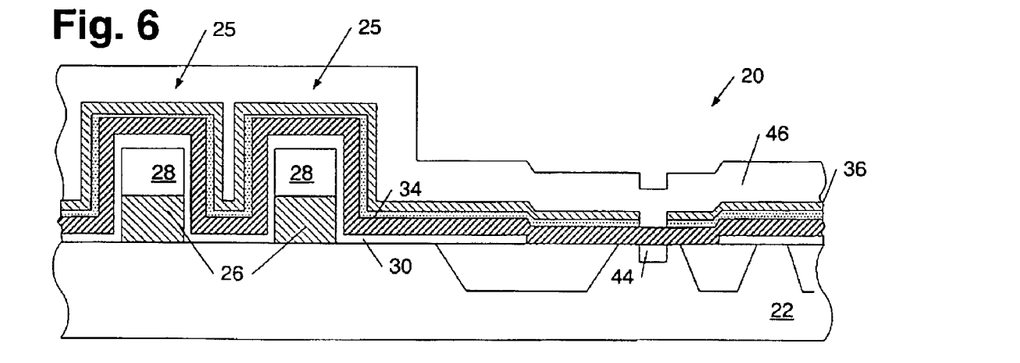
FIG. 6 depicts a partial cross-sectional view of the semiconductor topography in which a conductive layer has been deposited upon the cap layer subsequent to the formation of the opening within the dielectric layer in FIG. 5.

Subsequent to the cleaning process, conductive layer 46 may be deposited upon semiconductor topography 20 as shown in FIG. 6. Such a conductive layer may include a material such as, doped polysilicon, doped amorphous silicon, aluminum, copper, titanium, tungsten, or a metal alloy or silicide thereof. In cases in which conductive layer 46 includes amorphous silicon or polysilicon, conductive layer 46 may be insitu doped. For references used herein, "insitu doped" may refer to a material which has been doped during the deposition of the material. In other embodiments, the conductive layer 46 may be doped subsequent to the deposition of the material. In any case, the thickness of conductive layer 46 may be between approximately 1000 angstroms and approximately 3000 angstroms or more specifically, approximately 1800 angstroms. However, larger or smaller thicknesses of conductive layer 46 may be appropriate depending on the design specifications of the device. The deposition of conductive layer 46 may include any deposition techniques used in the semiconductor industry. For example, the deposition of conductive layer 46 may include a chemical vapor deposition (CVD) process or a physical vapor deposition (PVD) process.

Figure 7:
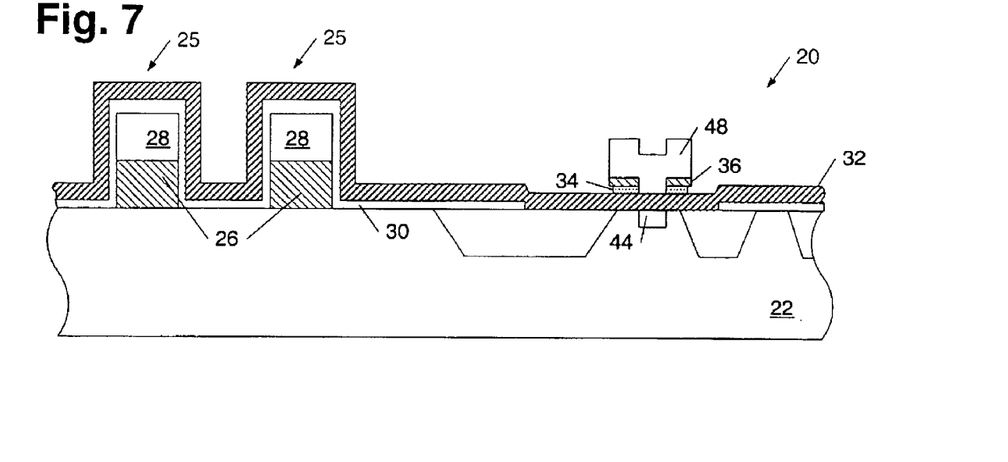
FIG. 7 depicts a partial cross-sectional view of the semiconductor topography in which the conductive layer, cap layer, and dielectric layer are patterned subsequent to the deposition of the conductive layer in FIG. 6.

FIG. 7 illustrates conductive layer 46 patterned to form conductive structure 48 of an emitter region of a bipolar transistor. In general, the bipolar transistor may further include a collector and base region. However, for illustrative purposes such regions are not shown in the cross-sectional view of the figures. One skilled in the art would be apprised of the structure of a bipolar transistor and therefore, would be familiar with the relation of the illustrated emitter region with respect to other regions within the bipolar transistor.

FIG. 7 further illustrates cap layer 36 and dielectric layer 34 patterned relatively aligned with conductive structure 48. As such, the patterning process used to form such a structure may include forming a resist mask (not shown) upon regions of semiconductor topography 20 including the patterned portions of the layers.

In cases in which cap layer 36 includes a conductive material, such as doped amorphous silicon or polysilicon, the patterned portion of cap layer 36 may be part of conductive structure 48. Alternatively, cap layer 36 may include dielectric material, such as substantially undoped amorphous silicon or polysilicon. In such an embodiment, cap layer 36 may not be a part of conductive structure 48. In either embodiment, conductive layer 46 and cap layer 36 may be patterned using substantially similar etch chemistries. Consequently, conductive layer 46 and cap layer 36 may be etched at similar rates. As a result, a lateral dimension of the patterned portions of cap layer 36 may be bound by sidewall surfaces of conductive structure 48 as shown in FIG. 7. In some embodiments, conductive layer 46 and cap layer 36 may be patterned concurrently in a single etch process. Alternatively, conductive layer 46 and cap layer 36 may be patterned in separate etch processes with substantially similar etch chemistries.

In yet other embodiments, cap layer 36 may include densified PECVD nitride layer or a LPCVD nitride layer. In such embodiments, cap layer 36 may include slightly different etch characteristics than conductive layer 46. Consequently, a different etch process may be needed to etch exposed portions of cap layer 36. In general, the etch rates of densified PECVD nitride and LPCVD nitride are substantially slower than non-densified PECVD nitride. As a result, the etching process of cap layer 36 may be more controlled in an embodiment in which cap layer 36 includes densified PECVD nitride or LPCVD nitride than in a conventional fabrication process in which a fast etching non-densified PECVD nitride layer is used. Consequently, a lateral dimension of the patterned portions of cap layer 36 may be bound by the sidewall surfaces of conductive structure 48 in an embodiments in which cap layer 36 includes densified PECVD nitride or LPCVD nitride as shown in FIG. 7.

In any case, the etch chemistry used to pattern conductive layer 46 and/or cap layer 36 may include hydrogen bromide and chlorine or carbon tetrafluoride. Other etch chemistry components, however, may be used to etch conductive layer 46 and/or cap layer 36 depending on the materials of the layers and the process parameters of the etch process. The etch characteristics of dielectric layer 34, however, may be substantially different than cap layer 36 and conductive layer 46 and therefore, may not be removed during the patterning of the two layers. In contrast, dielectric layer 34 may be patterned by an etch chemistry including hydrofluoric acid, for example. However, any etch components known to etch the material of dielectric layer 34 may be used during such an etch process. In some cases, the etch rate of dielectric layer 34 may be difficult to control using such an etch chemistry. As a result, a lateral dimension of the patterned portion of dielectric layer 34, may be narrower than the lateral dimension of conductive structure 48 as shown in FIG. 7.

Figure 8:
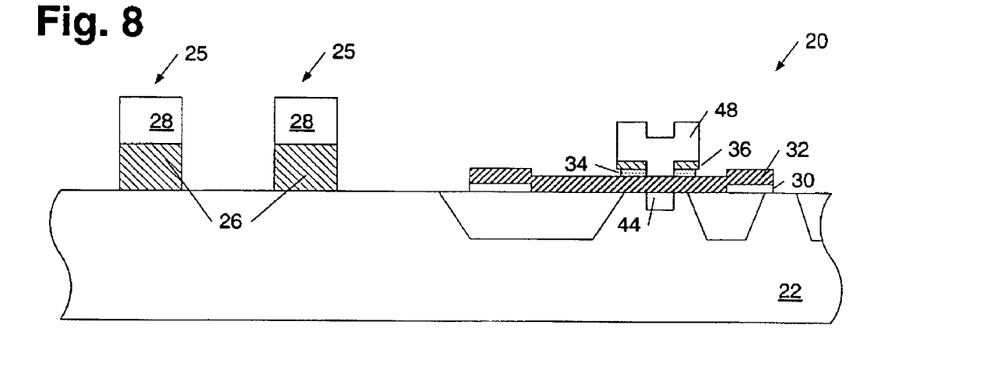
FIG. 8 depicts a partial cross-sectional view of the semiconductor topography in which the epitaxial layer has been patterned subsequent to patterning the conductive layer, cap layer, and dielectric layer in FIG. 7.

Subsequent to patterning conductive layer 46, cap layer 36, and dielectric layer 34, the resist mask (not shown) used for such patterning processes may be removed. A different resist mask (not shown) may then may deposited upon semiconductor topography 20 to pattern epitaxial layer 32. In addition, dielectric spacer 30 may be patterned in alignment with the patterned portion of epitaxial layer 32 as shown in FIG. 8. Such etch processes may include exposing semiconductor topography to an etch chemistry including hydrogen bromide and chlorine or carbon tetrafluoride. However, other etch chemistries may be used depending on the materials of the layers. After the removal of epitaxial layer 32 and/or dielectric spacer 30, additional device structures and layers may be fabricated upon semiconductor topography 20. For example, a plurality of resistors may be formed upon the topography adjacent to the bipolar transistor. An exemplary embodiment of forming a plurality of resistors is described in more detail below in reference to FIGS. 15 and 16. In addition or alternatively, one or more dielectric layers and metallization layers may be formed upon semiconductor topography to complete the fabrication of the integrated device.

Figure 9:
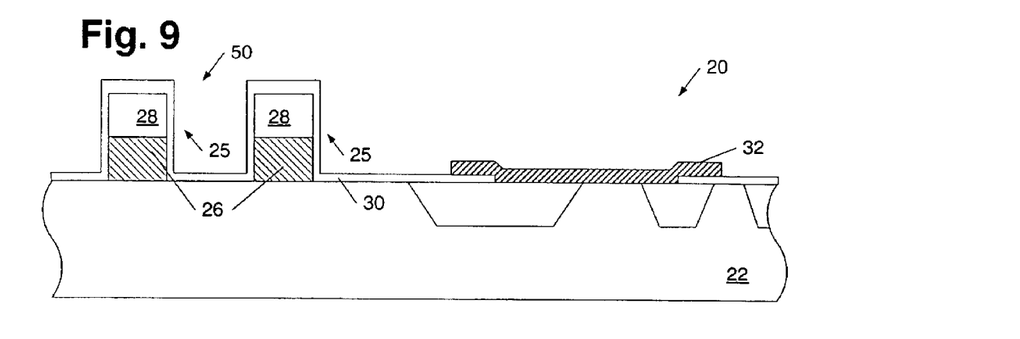
FIG. 9 depicts a partial cross-sectional view of the semiconductor topography of FIG. 1, in an alternative embodiment, in which the epitaxial layer has been patterned.
Figure 10:
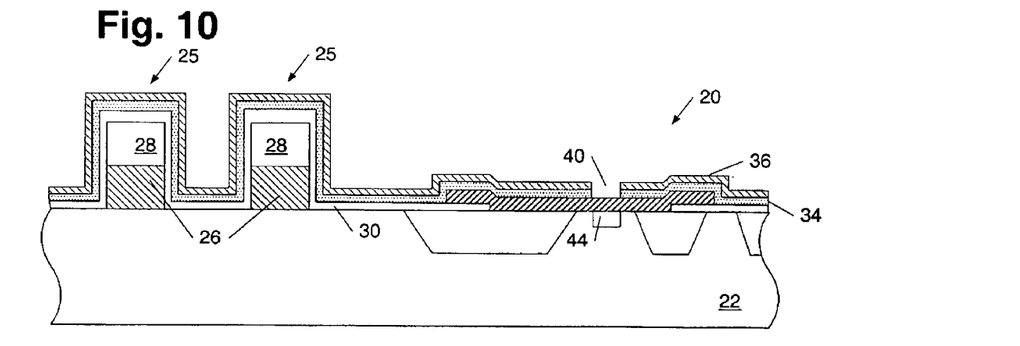
FIG. 10 depicts a partial cross-sectional view of the semiconductor topography in which a dielectric layer and a cap layer have been deposited subsequent to patterning the epitaxial layer in FIG. 9.
Figure 11:
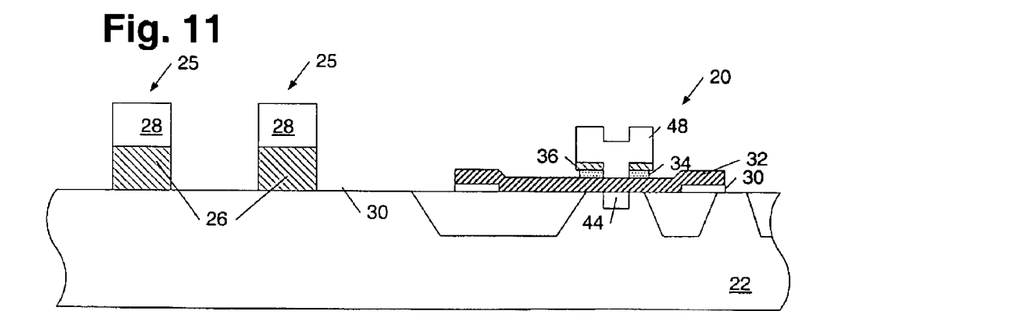
FIG. 11 depicts a partial cross-sectional view of the semiconductor topography in which a conductive layer has been formed and patterned subsequent to the formation of an opening within the dielectric layer and cap layer in FIG. 10.

A different embodiment of the method described herein is illustrated in FIGS. 9–11. In particular, an embodiment in which epitaxial layer 32 is pattered prior to the formation of the conductive emitter structure is shown in FIGS. 9–11. FIG. 9 illustrates patterned epitaxial layer 32 subsequent to the formation of the layer in FIG. 1. The patterning of epitaxial layer 32 may include forming a resist mask upon the layer and subsequently etching exposed portions. Such an etch process may include an etch chemistry comprising hydrogen bromide and chlorine or carbon tetrafluoride, for example. Other etch chemistry components, however, may be used depending on the material of epitaxial layer 32. As shown in FIG. 9, dielectric spacer 30 may remain upon semiconductor topography for the formation of the conductive emitter structure. In other embodiments, dielectric spacer 30 may be patterned in alignment with patterned epitaxial layer 32.

In either embodiment, patterning epitaxial layer 32 prior to the formation of the conductive emitter structure may increase the aspect ratio of space 50 between gate structures 25. In particular, the aspect ratio of space 50 may be greater than space 52 in FIG. 1, in which epitaxial layer 32 has not been patterned. In general, aspect ratio as used herein may refer to the ratio of the lateral dimension and the vertical dimension of the referenced space. An increase in the aspect ratio of a space between gate structures 25 may be particularly advantageous in devices in which spacing is minimized between submicron gate structures such that more transistors may be fabricated upon a wafer. For example, additional layers may be deposited upon semiconductor topography 20 in a more uniform manner around the periphery of gate structures 25. In particular, dielectric layer 34 and cap layer 36 may be deposited upon semiconductor topography 20 as shown in FIG. 10 such that the thickness of the deposited layers are not substantially greater between gate structures 25 than in other regions of semiconductor topography 20.

The deposition of dielectric layer 34 and cap layer 36 may be similar to that of the deposition of dielectric layer 34 and cap layer 36 described in FIGS. 2 and 3 and therefore, may include CVD or PVD techniques. Furthermore, dielectric layer 34 may include similar materials and thicknesses as described for dielectric layer 34 in FIG. 2. Likewise, cap layer 36 may include similar materials and thicknesses as cap layer 36 as described in reference to FIG. 3. As such, cap layer 36 may include materials having substantially similar etch characteristics as a subsequently deposited conductive layer used to form the conductive structure of the emitter region of the bipolar transistor. For example, cap layer 36 may include an amorphous silicon or polysilicon material, either insitu doped, implanted doped polysilicon, or substantially undoped. In other cases, however, cap layer 36 may include a material having substantially different etch characteristics than the conductive layer used to form the conductive structure of the bipolar transistor. For example, in some embodiments, cap layer 36 may include other materials, such as silicon oxide, silicon nitride, or silicon oxynitride.

In either case, cap layer 36 is preferably deposited at a relatively low temperature. In particular, cap layer 36 may be deposited at a temperature between 300° C. and approximately 650° C., or more specifically at approximately 400° C. Such a relatively low-temperature deposition process may allow the thermal budget of the device to be maintained, increasing the reliability of the device. In particular, a low thermal budget may allow the stability of the epitaxial layer to be maintained. However, in cases in which cap layer 36 includes silicon nitride, the layer may be particularly porous and substantially etch selective to a variety of dilute etch chemistries. As such, in an embodiment in which cap layer 36 includes silicon nitride, cap layer 36 may be densified subsequent to being deposited as described above in reference to FIG. 3. In particular, cap layer 36 may be densified to increase the etch rate of the layer.

FIG. 10 also illustrates cap layer 36 and dielectric layer 34 patterned to expose a portion of semiconductor substrate 22. Such an exposure outlines an opening in which a conductive structure of the emitter region of a bipolar transistor may be formed. The patterning of the opening may be similar to that of patterning of cap layer 36 in FIG. 4 and the cleaning process used to remove residual portions of dielectric layer 34 as described in reference to FIG. 5. In addition, the removal of the resist mask used to pattern such an opening may be similar to the resist removal process described in FIG. 5. In an embodiment in which cap layer 36 includes non-densified silicon nitride, the resist removal process may not be as apt to etch through cap layer 36 in the regions of gate structures 25 than in cases in which epitaxial layer 32 is not patterned prior to the formation of the bipolar transistor. Such a reduction in the possibility of etching through cap layer 36 is due to the increased aspect ratio between gate structures 25. As explained above, such an increase in the aspect ratio is due to the patterning of epitaxial layer 32 prior to the formation of the bipolar transistor.

In addition or alternatively, cap layer 36 may be even less apt to be etched during the resist removal process in an embodiment in which cap layer 36 includes densified silicon nitride. In particular, the densified silicon nitride may be less etch selective to the resist removal process. Therefore, underlying portions of dielectric layer 34 and gate structures 25 are less likely to be etched during the resist removal process. In this manner, the reliability of the device may be increased by the inclusion of a densified silicon nitride material and/or the process of patterning epitaxial layer 32 prior to the formation of the bipolar transistor. In other embodiments, cap layer 36 may include amorphous silicon as described above in reference to FIG. 3. In such an embodiment, cap layer 36 may be even further prevented from being etched during the resist removal process.

FIG. 11 illustrates the formation of conductive structure 48. In addition, FIG. 11 illustrates the patterning of cap layer 36 and dielectric layer 34. Such a formation may be similar to the formation of conductive structure 48 and the patterning of cap layer 36 and dielectric layer 34 in FIG. 7. As such, conductive structure 48 may include similar materials and thicknesses as conductive layer 46. In addition, forming conductive structure 48 may include depositing a conductive layer upon semiconductor topography 20 in a manner similar to the deposition of conductive layer 46 in FIG. 6. Moreover, the conductive layer may be patterned to form conductive structure 48 in a manner similar to the patterning of conductive layer 46 in FIG. 7. In addition, patterning cap layer 36 and dielectric layer 34 may be similar to the patterning of cap layer 36 and dielectric layer 34 in FIG. 7.

Figure 12:
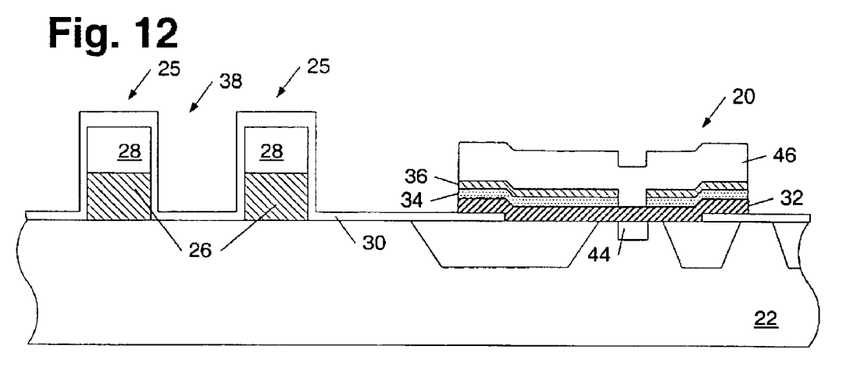
FIG. 12 depicts a partial cross-sectional view of the semiconductor topography, in an alternative embodiment, in which a conductive layer has been formed and patterned in alignment with the patterned epitaxial layer subsequent to the formation of an opening within the dielectric layer and cap layer in FIG. 10.
Figure 13:
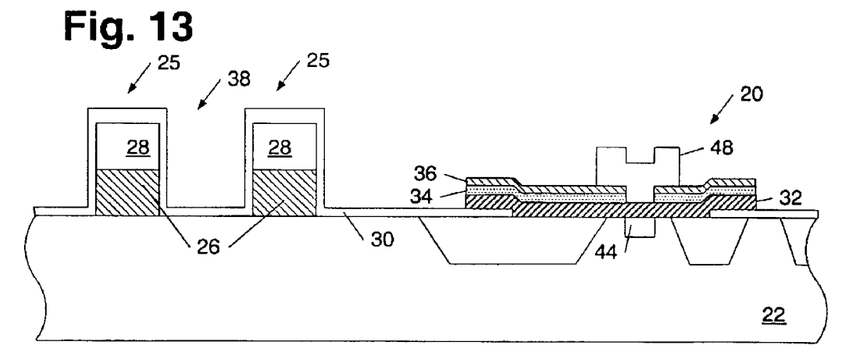
FIG. 13 depicts a partial cross-sectional view of the semiconductor topography in which the conductive layer has been further patterned subsequent to patterning the conductive layer in FIG. 12.
Figure 14:
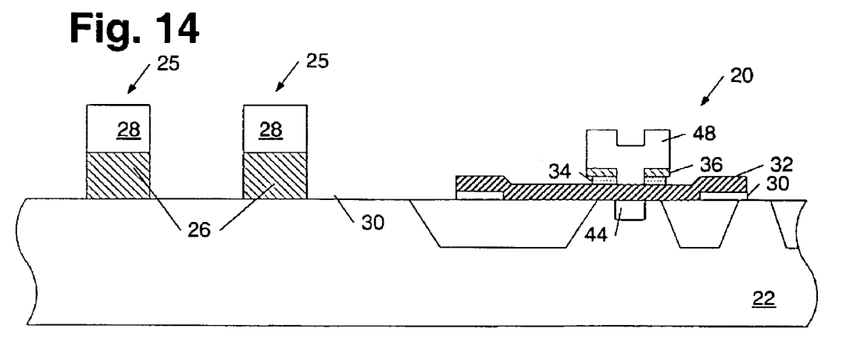
FIG. 14 depicts a partial cross-sectional view of the semiconductor topography in which exposed portions of the cap layer and dielectric layer are removed subsequent to the further patterning of the conductive layer in FIG. 13.

Alternatively, the conductive layer may be patterned using two different resist masks. Such a fabrication sequence is illustrated in FIGS. 12–14. FIG. 12 illustrates the patterning of conductive layer 46 subsequent to formation of opening 40 within cap layer 36 and dielectric layer 34 in FIG. 10. Such a pattering process may be conducted by the use of a first resist mask (not shown). As illustrated in FIG. 12, such a patterning process may further include patterning cap layer 36 and dielectric layer 34 to be aligned with the patterned portion of conductive layer 46 and underlying portions of epitaxial layer 32. Such a fabrication sequence may further include removing the first resist mask and subsequently forming a second resist mask (not shown) upon a portion of the patterned layers. In this manner, conductive layer 46 may be further patterned to form conductive structure 48 as shown in FIG. 13. Subsequently, the second resist mask may be removed.

FIG. 14 illustrates patterning dielectric spacer 30, cap layer 36, and dielectric layer 34 using conductive structure 48 and remaining portions of epitaxial layer 32 as a masks for the respective underlying layers of each structure. In this manner, upper portions of epitaxial layer 32 may be protected from substantially etching since dielectric spacer 30, cap layer 36, and dielectric layer 34 may be etched at substantially the same rate. This may be particularly true in embodiments in which dielectric spacer 30 includes silicon nitride and silicon dioxide. In any case, semiconductor topography 20 may be further processed by for the formation of dielectric or conductive layers above the topography shown in FIG. 14. In particular, semiconductor topography 20 may be further processed by the deposition of one or more dielectric layers and/or metallization layers above the fabricated bipolar transistor.

Figure 15:
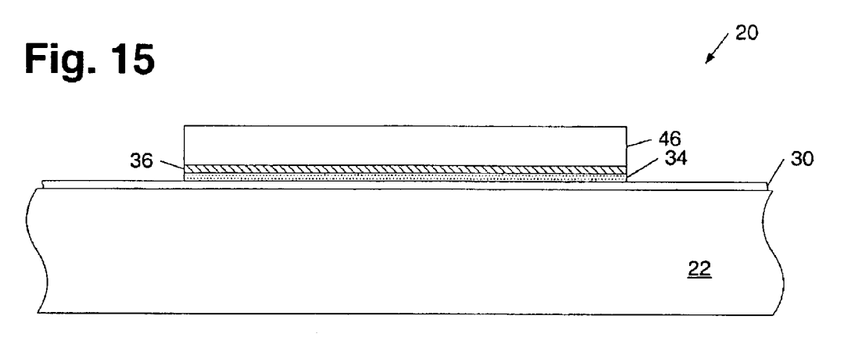
FIG. 15 depicts a different partial cross-sectional view of the semiconductor topography in which in which a single resistor structure is formed subsequent to patterning of conductive layer in FIG. 11 or FIG. 12.
Figure 16:
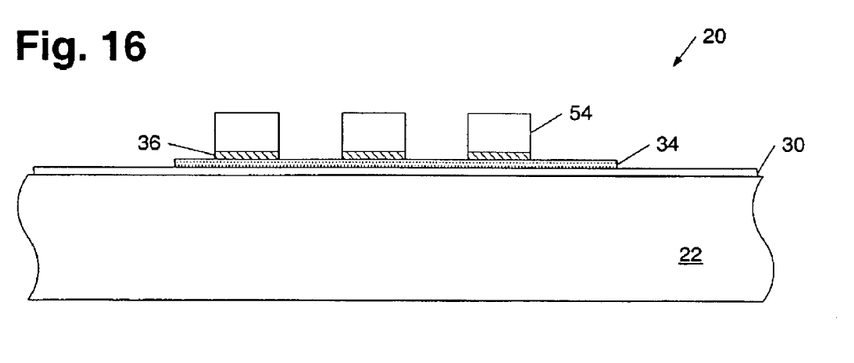
FIG. 16 depicts a partial cross-sectional view of the semiconductor topography in which the single resistor structure is patterned subsequent to the formation of the single resistor structure in FIG. 15.

In some cases, the embodiment of the method described in FIGS. 9–11 and FIGS. 12–14 may allow other devices to be fabricated during the fabrication of the bipolar transistor. For example, a plurality of resistors may be fabricated within semiconductor topography 20 during the patterning of conductive layer 46. Such an embodiment is illustrated in FIGS. 15 and 16. FIG. 15 depicts a cross-sectional view of semiconductor topography 20 in a different region of the topography than where the emitter region of the bipolar transistor is formed. In particular, FIG. 15 depicts semiconductor topography 20 in a different cross-sectional view than FIGS. 1–14. Such a figure depicts semiconductor topography 20 subsequent to the first patterning process in which conductive layer 46, cap layer 36 and dielectric layer 34 have been patterned. In some cases, FIG. 15 may illustrate one of a plurality of resistors that may be patterned during the patterning of conductive layer 46. Such a formation may be included in the patterning process described in reference to FIG. 11 or the first patterning process of FIG. 12. In other embodiments, FIG. 15 may illustrate a transitional structure from which a plurality of resistors may be formed. Such a process sequence may be particularly advantageous in an embodiment in which a plurality of resistors including a similar dielectric layer may be desired. In such an embodiment, the second resist mask used to further pattern conductive layer 46 as described in reference to FIG. 13 may be used to pattern the transitional structure formed in FIG. 15. FIG. 16 shows the transitional structure patterned to form a plurality of resistor structures 54 with a common dielectric layer.

In either case, the formation of such additional structures during the fabrication of the bipolar transistor may be attributed to the patterning of epitaxial layer 32 prior to the deposition of conductive layer 46. In particular, the patterning of epitaxial layer 32 allows the layer to be removed in regions of semiconductor topography 20 in which formation of other device structures may be desirable. In this manner, the bipolar transistor and other device structures may be formed concurrently, reducing process steps of the fabrication sequence. As a result, production throughput may be increased and fabrication costs may be reduced. In addition, the formation of resistor structures during the fabrication of the bipolar transistor allows the structures to be fabricated with both dielectric layer 34 and cap layer 36 interposed between the conductive portions of the resistor structures and semiconductor substrate 22. In an embodiment in which cap layer 36 is a dielectric material, the increased dielectric thickness may reduce the parasitic capacitance to semiconductor substrate 22. Resistor structures fabricated in conventional processes may not generally include a dielectric stack with such an increase dielectric stack.

It will be appreciated to those skilled in the art having the benefit of this disclosure that this invention is believed to provide a method for fabricating a bipolar transistor and a device comprising a bipolar transistor. Further modifications and alternative embodiments of various aspects of the invention will be apparent to those skilled in the art in view of this description. For example, the methods described herein may be used for either NPN or PNP bipolar transistors. Moreover, the methods may be used for the fabrication of BiCMOS transistors or bipolar transistors that are not used in conjunction with CMOS transistors. It is intended that the following claims be interpreted to embrace all such modifications and changes and, accordingly, the drawings and the specification are to be regarded in an illustrative rather than a restrictive sense.

What is claimed is:

1. A method for fabricating a bipolar transistor, comprising:
   depositing an intermediate layer above a semiconductor topography;
   patterning an opening within the intermediate layer using a resist mask;
   exposing the semiconductor topography to a stripping process to remove the resist mask and expose portions of the intermediate layer, wherein the intermediate layer comprises a material substantially etch resistant to the stripping process;
   depositing a conductive layer within the opening and upon exposed portions of tie intermediate layer;
   patterning the conductive layer to form an emitter structure of the bipolar transistor; and
   patterning the exposed portions of the intermediate layer in alignment with a patterned portion of the conductive layer using substantially similar etch process parameters as used in the step of patterning the conductive layer, wherein the stop of patterning the conductive layer comprises:
      patterning the conductive layer to form the patterned portion of the conductive layer; and
      re-patterning the conductive layer subsequent to the step of patterning the intermediate layer in alignment with the patterned portion of the conductive layer to expose portions of the patterned intermediate layer.

2. The method of claim 1, wherein the semiconductor topography is substantially nonplanar, and wherein depositing the intermediate layer comprises conformally depositing the intermediate layer above the semiconductor topography such that the thickness variation of the deposited intermediate layer varies by less than approximately 20% across the semiconductor topography.

3. The method of claim 1, wherein the step of depositing the intermediate layer comprises depositing the intermediate layer above a patterned epitaxial layer formed upon the semiconductor topography.

4. The method of claim 1, wherein the steps of patterning the conductive layer and patterning the exposed portions of the intermediate layer are conducted in a single etch process.

5. A method for fabricating a semiconductor device comprising:
   fabricating one or more gate structures upon a semiconductor topography;
   depositing a dielectric spacer and an epitaxial layer above the gate structures;
   patterning the epitaxial layer to expose portions of the dielectric spacer;
   depositing an intermediate layer above the exposed portions of the dielectric spacer and remaining portions of tho epitaxial layer; and
   forming an emitter structure of a bipolar structure above and within the intermediate layer.

6. The method of claim 5, wherein the step of forming the emitter structure comprises forming a conductive layer above tho intermediate layer, and wherein the conductive layer comprises substantially similar etch characteristics as the intermediate layer.

7. The method of claim 6, wherein the step of depositing the intermediate layer comprises depositing polysilicon.

8. The method of claim 5, wherein the step of depositing the intermediate layer comprises conformally depositing the intermediate layer above and about the one or more gate structures such that the thickness of the intermediate layer is substantially uniform along peripheries of the one or more gate structures and in spacings between the one or more gate structures.

9. The method of claim 5, further comprising forming a plurality of resistors above the semiconductor topography subsequent to the step of depositing the intermediate layer, wherein the step to forming the plurality of resistors comprises:
   forming a conductive layer above the intermediate layer;
   patterning the conductive layer and underlying portions of the intermediate layer to form a transitional structure; and
   patterning the transitional structure to form the plurality of resistors having a common dielectric layer.

10. The method of claim 9, wherein the step of forming the plurality of resistors is conducted simultaneously with the step of forming the emitter structure.

11. The method of claim 5, further comprising exposing the intermediate layer to a rapid thermal anneal prior to the step of forming the emitter structure.

12. The method of claim 11, wherein the step of depositing the intermediate layer comprises depositing silicon nitride.

13. A method for fabricating a bipolar transistor comprising etching a dielectric spacer in alignment with an overlying patterned epitaxial layer while simultaneously etching a cap layer arranged above the patterned epitaxial layer in alignment with a patterned emitter structure of the bipolar transistor, wherein the patterned epitaxial layer comprises a width greater than a width of the patterned emitter structure.

14. The method of claim 13, further comprising:
depositing a dielectric layer upon the patterned epitaxial layer;
depositing the cap layer upon the dielectric layer;
etching an opening within the cap layer and the dielectric layer; and
depositing a conductive layer within the opening and upon the cap layer prior to the steps of etching the dielectric spacer and cap layer.

15. The method of claim 14, further comprising the patterning conductive layers to form the patterned emitter structure.

16. The method of claim 15, wherein the step of depositing the cap layer comprises depositing insitu doped polysilcon.

17. The method of claim 14, wherein the step of etching the cap layer further comprises etching the dielectric layer.

18. The method of claim 17, wherein the stop of depositing the cap layer comprises depositing undoped polysilcon.

19. The method of claim 17, wherein the step of depositing the cap layer comprises depositing densified silicon nitride.

* * * * *

UNITED STATES PATENT AND TRADEMARK OFFICE
CERTIFICATE OF CORRECTION

PATENT NO. : 6,803,289 B1
DATED : October 12, 2004
INVENTOR(S) : Gopalan et al.

It is certified that error appears in the above-identified patent and that said Letters Patent is hereby corrected as shown below:

Column 17,
Line 53, please delete "tie intermediate" and substitute therefor -- the intermediate --.
Line 60, please delete "wherein the stop" and substitute therefor -- wherein the step --.

Column 18,
Line 27, please delete "tho epitaxial layer" and substitute therefor -- the epitaxial layer --.
Line 32, please delete "above tho" and substitute therefor -- above the --.
Line 48, please delete "step to" and substitute therefor -- step of --.

Column 20,
Lines 1 and 2, please delete "comprising the patterning" and substitute therefor -- comprising patterning --.
Line 6, please delete "polysilcon" and -- polysilicon --.
Line 8, please delete "the stop" and substitute therefor -- the step --.
Line 9, please delete "polysilcon" and substitute therefor -- polysilicon --.

Signed and Sealed this

Eighth Day of February, 2005

JON W. DUDAS
*Director of the United States Patent and Trademark Office*